(12) United States Patent
Daufeld et al.

(10) Patent No.: US 12,320,692 B2
(45) Date of Patent: Jun. 3, 2025

(54) FILL-LEVEL MEASURING DEVICE

(71) Applicant: Endress+Hauser SE+Co. KG, Maulburg (DE)

(72) Inventors: Ghislain Daufeld, Village Neuf (FR); Arnd Kempa, Steinen (DE); Stefan Gorenflo, Hausen (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 1009 days.

(21) Appl. No.: 17/415,069

(22) PCT Filed: Nov. 21, 2019

(86) PCT No.: PCT/EP2019/082020
§ 371 (c)(1),
(2) Date: Jun. 17, 2021

(87) PCT Pub. No.: WO2020/126275
PCT Pub. Date: Jun. 25, 2020

(65) Prior Publication Data
US 2022/0065681 A1    Mar. 3, 2022

(30) Foreign Application Priority Data
Dec. 19, 2018 (DE) .................. 10 2018 132 870.2

(51) Int. Cl.
*G01F 23/263* (2022.01)
*G01F 25/20* (2022.01)

(52) U.S. Cl.
CPC ............ *G01F 23/266* (2013.01); *G01F 25/20* (2022.01)

(58) Field of Classification Search
CPC ............................. G01F 23/266; G01F 25/20
(Continued)

(56) References Cited

U.S. PATENT DOCUMENTS

2007/0205772 A1    9/2007  Woehrle
2016/0266211 A1*   9/2016  Imaizumi ............. G01R 31/389
2017/0170659 A1*   6/2017  Kech .................... H02J 1/06

FOREIGN PATENT DOCUMENTS

CN          1654930 A     8/2005
CN        103339481 A    10/2013
(Continued)

*Primary Examiner* — Daniel S Larkin
*Assistant Examiner* — Nashmiya S Fayyaz
(74) *Attorney, Agent, or Firm* — Brannon Sowers & Cracraft PC

(57) ABSTRACT

Disclosed is a method for determining the serviceability of a fill-level measuring device that includes at least one electronic unit. The method can be applied to any type of field device that includes at least one electronic unit supplied by an energy store of the field device. The method includes: measuring the capacitance of the energy store and/or measuring the power withdrawal at the energy store. The field device is classified as not operationally reliable if the capacitance of the energy store is below a defined minimum capacitance and/or if the power withdrawal deviates from a predefined normal consumption. An advantage of the method according to the invention is that, in addition to the functional diagnosis, in particular also a prediction up to the expected elapsing of the remaining operating time can be created by recording the power withdrawal or the capacitance over progressive measurement cycles.

12 Claims, 3 Drawing Sheets

(58) Field of Classification Search
USPC .......................................... 73/290 R, 290 V
See application file for complete search history.

(56) References Cited

FOREIGN PATENT DOCUMENTS

| | | | | |
|---|---|---|---|---|
| CN | 108139260 | A | | 6/2018 |
| DE | 10150128 | A1 | | 4/2003 |
| DE | 102017100269 | A1 | | 7/2018 |
| EP | 0665443 | A1 | | 8/1995 |
| EP | 2239546 | A1 | | 10/2010 |
| JP | 2010246214 | A | * | 10/2010 |
| JP | 2016142673 | A | * | 8/2016 |
| SU | 997145 | A1 | * | 2/1983 |
| WO | WO-2017194396 | A1 | * | 11/2017 ........... G01R 31/386 |
| WO | 2018127356 | A1 | | 7/2018 |

* cited by examiner

FILL-LEVEL MEASURING DEVICE

CROSS-REFERENCE TO RELATED APPLICATIONS

The present application is related to and claims the priority benefit of German Patent Application No. 10 2018 132 870.2, filed on Dec. 19, 2018 and International Patent Application No. PCT/EP2019/082020, filed on Nov. 21, 2019, the entire contents of which are incorporated herein by reference.

TECHNICAL FIELD

The invention relates to a method for checking the serviceability and the expected remaining service time of a field device.

BACKGROUND

Field devices are used in process automation technology to determine corresponding process variables. For this purpose, the functioning of the field devices is in each case based on suitable measuring principles in order to capture process variables, such as fill level, flow rate, pressure, temperature, pH value, redox potential, or conductivity. A wide variety of such field devices is manufactured and distributed by the Endress+Hauser company.

For measuring the fill level of filling materials in containers, radar- and ultrasound-based measuring methods have become established since they are robust and require minimum maintenance. A key advantage of these measuring methods lies in their ability to measure the fill level quasi-continuously. In the context of this patent application, the term "radar" refers to signals or electromagnetic waves having frequencies between 0.03 GHz and 300 GHz. The term "ultrasound" is understood to mean acoustic signals having a frequency between 12 kHz and 10 MHz.

In general, the serviceability of field devices as uptime accumulates can be lost due to internal aging effects or due to environmental influences. This can be caused, for example, by the decrease in capacitance in buffer capacitors, by oscillators detuning or by impedance changes in amplifier units. This can be problematic, on the one hand, if it is not discernible from the outside that the process variable or fill level is no longer being correctly detected. This may cause critical states in the process plant, such as overfilling of the container. On the other hand, an unexpectedly occurring functional failure of the device can lead to long downtimes of the process plant, as a result of which the operator may incur considerable financial damage.

SUMMARY

The object of the invention is therefore to provide a method by means of which serviceability and the remaining service time of the field device can be monitored.

The invention solves this object by a method for determining the serviceability of a field device which comprises at least one electronic unit for measuring a process variable. The electronic unit at least is supplied by an energy store of the field device. The method comprises the following method steps:

Measuring the capacitance of the energy store, and/or
Measuring the power consumption at the energy store.

According to the invention, the field device is classified as unserviceable if the capacitance of the energy store falls below a defined minimum capacitance, or/and if the power consumption deviates from a predefined normal consumption. Since the capacitance of the energy store often depends on the temperature at the fill-level measuring device, depending on the field of application of the field device, it may be advantageous if the temperature is measured at the field device and if the permitted minimum capacitance of the energy store is defined as a function which depends on the measured temperature.

Another advantage of the methods according to the invention is that the field device itself can check its own serviceability so as to be able to indicate this in the case of doubt or report this to a higher-level process control center. In addition, it is not only possible to diagnose whether the field device is functionally unsuitable overall but a check can also be made as to which of the individual components is defective and thus causing the functional failure of the field device. In the case of an undershot minimum capacitance, the energy store is considered defective. If the measured power consumption deviates from the normal consumption, one of the electrical units which are supplied by the energy store should be regarded as defective.

According to the invention, it is not prescribed in a fixed manner how the capacitance of the energy store or the power consumption is measured at the energy store. The capacitance can be measured, for example, by measuring a voltage drop over time across the energy store during a defined discharge of the energy store. It is possible to derive the capacitance thus:

$$U_2 = U_1 * e^{-\frac{t}{R*C}}.$$

The power consumption at the energy store can also be determined by measuring the voltage drop. After the electronic unit to be tested has been switched on for a defined time period in which all other electronic units of the field device fed by the energy store are switched off, the voltage drop over time at the energy store can accordingly be measured thus:

$$p_{11,12} = C * \frac{(U_1 - U_2)^2}{2*t}$$

In the case of voltage measurement, the field device must accordingly be classified as unserviceable, in that the measured voltage drop exceeds a predefined maximum voltage drop.

Based on the method according to the invention, a prediction on the principle of "predictive maintenance" can additionally be made as to how much remaining service time is left until a possible functional failure of the fill-level measurement device, provided the fill-level measurement device is currently still serviceable. The prediction can be made on the basis of the expected remaining service time of the energy store or also on the basis of the expected remaining service time of the electronic units. In the case of the energy store, for example, in the event that the capacitance of the energy store does not currently lie below the defined minimum capacitance, a change function of the capacitance can be determined via continuous measuring cycles. This can be done by approximating the capacitances measured over the measurement cycles (in which the process variable is determined) by a suitable mathematical function. A remaining service time until the minimum capacitance is undershot can thus be calculated on the basis of the current capacitance and on the basis of the capacitance change function.

Analogously to the remaining service time of the energy store, a corresponding change function of the power consumption can also be determined for one of the electronic units via progressive measurement cycles by approximating the power consumptions measured via the measurement cycles by a suitable mathematical function. A prerequisite for this is, in turn, that the power consumption at the energy store currently does not deviate significantly from the normal consumption. It goes without saying that, in order to determine the expected remaining service time of the electronic unit in question during power consumption, only that particular electronic unit will be allowed to be fed by the energy store. All other units must be switched off accordingly during the power consumption. A second remaining service time until a minimum deviation is exceeded for normal consumption can thus be calculated on the basis of the current power consumption and on the basis of the corresponding change function.

Depending on which of the calculated remaining service times (i.e. the remaining service time of the energy store or the remaining service time of one of the electronic units) is shorter, the shortest remaining service time can be defined as the relevant remaining service time until the expected functional failure of the field device.

If the estimated remaining service time of the field device is not to be determined on the basis of the serviceability of individual components, it is also possible to determine the remaining service time solely on the basis of the voltage drop at the energy store (during capacitance measurement or during measurement of power consumption). A precondition thereof is again that the measured voltage drop has not yet exceeded the predefined maximum voltage drop. A change function of the voltage drop must accordingly be determined via progressive measuring cycles, in that the voltage drops measured in each case over progressive measuring cycles are approximated by a suitable mathematical function. The remaining service time until the maximum voltage drop, that is to say up until the functional failure of the field device, can thus be calculated on the basis of the current value of the voltage drop and on the basis of the corresponding change function. Irrespective of the basis on which the change function was established, a suitable functional type for the respective change function can be determined, for example, by means of the least squares method.

Analogously to the method according to the invention, the object underlying the invention is achieved by a radar-based fill-level measurement device, which is for measuring a filling material located in a container. The fill-level measuring device comprises the following components for carrying out the method:
an energy store,
a signal-generating unit which is fed by the energy store and is designed to emit a radar or ultrasound signal in the direction of the filling material,
an evaluation unit which is fed by the energy store and is designed to determine the fill level on the basis of the signal reflected on the filling material surface,
a control unit that is designed to
to switch on and off the signal-generating unit and/or the evaluation unit or individual functional blocks thereof,
to determine the power consumption at the energy store, and
to determine the capacitance of the energy store, and
to classify the field device as unserviceable, in that the capacitance of the energy store falls below the minimum capacity, or the power consumption deviates from the defined normal consumption.

In order to make a prediction up to unserviceability, it is advantageous if the control unit is designed to determine a corresponding remaining service time on the basis of the measured capacitance and/or on the basis of the measured power consumption, provided the control unit currently classifies the fill-level measuring device as serviceable. In this context, it is also advantageous if the control unit is designed to transmit any unserviceability or a predicted remaining service time to a higher-level unit, such as a process control unit. The method according to the invention is particularly suitable when the energy store is designed as a buffer capacitor, since capacitors exhibit corresponding degradation phenomena with increasing measuring cycles. For recharging the energy store, the fill-level measuring device can be designed, for example, such that the energy store can be connected to the higher-level unit.

Within the scope of the invention, the term "unit" shall, in principle, be understood to mean an electronic circuit that is suitably designed for its intended purpose. Depending on the requirement, it can therefore be an analog circuit for generating or processing corresponding analog signals. However, it can also be a (semiconductor-based) digital circuit, such as an FPGA or a storage medium in interaction with a program. In this case, the program is designed to carry out the corresponding method steps or to apply the necessary calculation operations of the respective unit. In this context, various electronic units of the fill level measurement device in the sense of the invention can potentially also access a common physical memory or be operated by means of the same physical digital circuit.

BRIEF DESCRIPTION OF THE DRAWINGS

The invention is explained in more detail with reference to the following figures. The following is shown.

DETAILED DESCRIPTION

Figure 1:
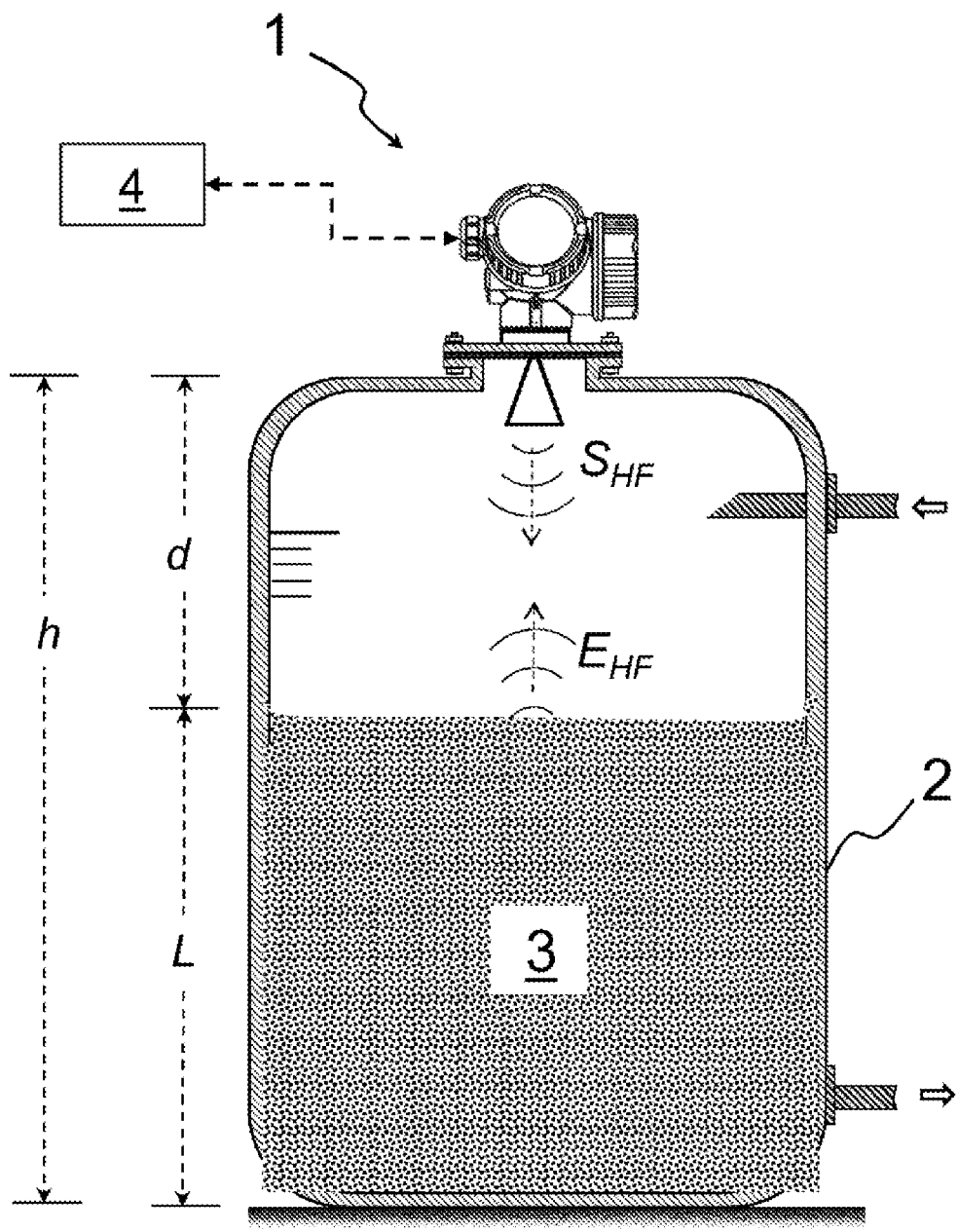
FIG. 1 shows a typical arrangement of a radar- or ultrasound-based fill-level measurement device.

The method according to the invention for evaluating the serviceability of field devices is explained in more detail below using the example of fill-level measurement. For a basic understanding, FIG. 1 shows a typical arrangement of a radar-based fill-level measurement device 1 on a container 2. In the container 2 is a filling material 3, whose fill level L is to be determined by the fill-level measurement device 1. For this purpose, the fill-level measurement device 1 is mounted on the container 2 above the maximum permissible fill level L. Depending on the field of application, the height h of the container 2 can be up to 125 m.

Figure 2:
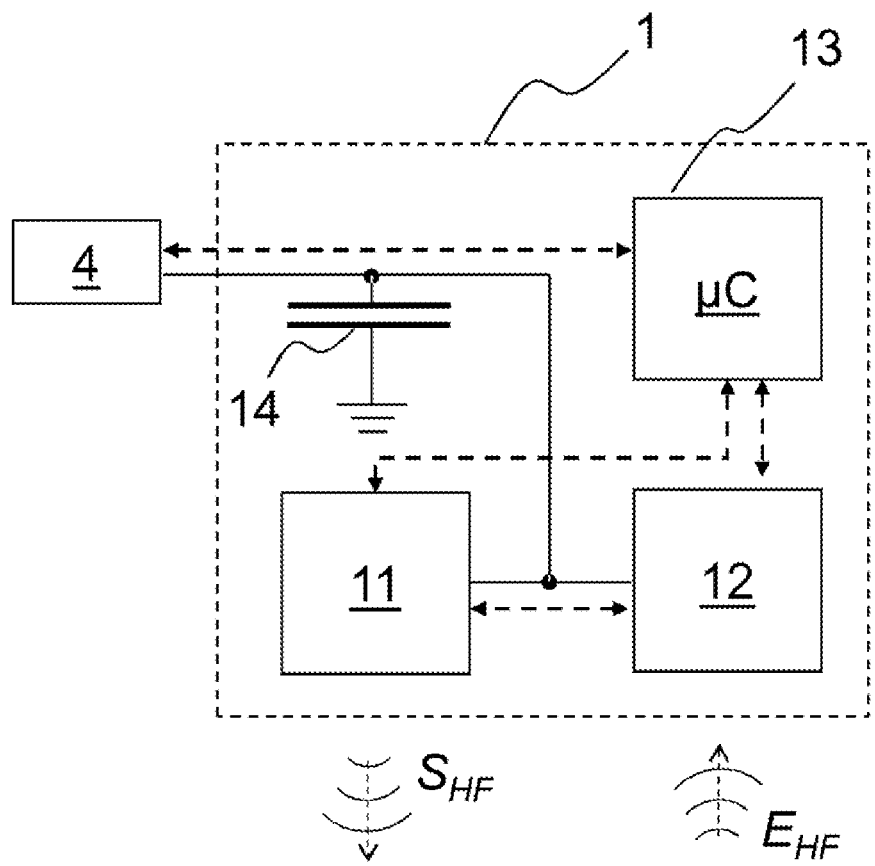
FIG. 2 shows a circuit design of the fill-level measurement device.

The fill-level measuring device 1 is oriented in such a way that the radar or ultrasound signals SHF generated by the signal-generating unit 11 (cf. FIG. 2) are emitted in the direction of the filling material 3. The signals EHF are reflected at the surface of the filling material 3 and received after a corresponding signal propagation time by an evaluation unit 12 of the fill-level measuring device 1. The signal propagation time of the signals SHF, EHF depends on the distance d=h−L of the fill-level measurement device 1 from the filling material surface.

Like field devices in general, the fill-level measuring device in FIG. 1 is also connected via a bus system to a higher-level unit 4, for example a process control system or a decentralized database. On the one hand, information about the operating status of the fill-level measurement device 1 can thus be communicated. On the other hand, information about the measured process variable or the fill level L can also be transmitted via the bus system in order to control any inflows or outflows that may be present at the container 2. The fill-level measuring device 1 is also supplied with power via the bus system, depending on the design. Since the fill-level measuring device 1 is often used in explosion-endangered installations, the corresponding interface of the fill-level measuring device 1 is generally designed to be power-limited. Accordingly, for example, the interface may be designed to communicate using power-saving protocols such as "Ethernet", "PROFIBUS", "HART" or "Wireless HART".

In order to be able to periodically briefly supply sufficient power for the actual measurement, the fill-level measuring device 1 or the field device is generally connected to the higher-level unit 4 via a buffer capacitor 14 or an equivalent energy store. In the circuit configuration of the fill-level measuring device 1 shown in FIG. 2, the signal-generating unit 11 and the evaluation unit 12 are therefore supplied with power via the buffer capacitor 14. Continuous lines represent the power supply, and dashed lines represent data transmission. In this case, the power supply of further electronic units can also be effected via the buffer capacitor 14. In order that the buffer capacitor 14 can be recharged between individual measurements, the fill-level measuring device 1 is designed such that it controls the clock rate fc, at which it in each case remeasures the fill level L, as a function of the state of charge of the buffer capacitor 14. The higher the state of charge of the capacitor 14, the more often the fill level L or generally the process variable is measured.

As measuring cycles of the fill-level measuring device 1 proceed, the risk of the buffer capacitor 14 or even the electronic units 11, 12 degrading increases. The capacitance of the buffer capacitor 14 may thus decrease with increasing age. In the case of the electronic units 11, 12, for example, oscillators may detune or short circuits may occur. Depending on the circuit unit 11, 12, this can result in a false fill level L being obtained without this being discernible from outside. This entails the risk of incorrectly controlling actuators of the process plant coupled thereto, such as pumps or outlets on the container 2, on the basis of the incorrect fill-level value.

Figure 3:
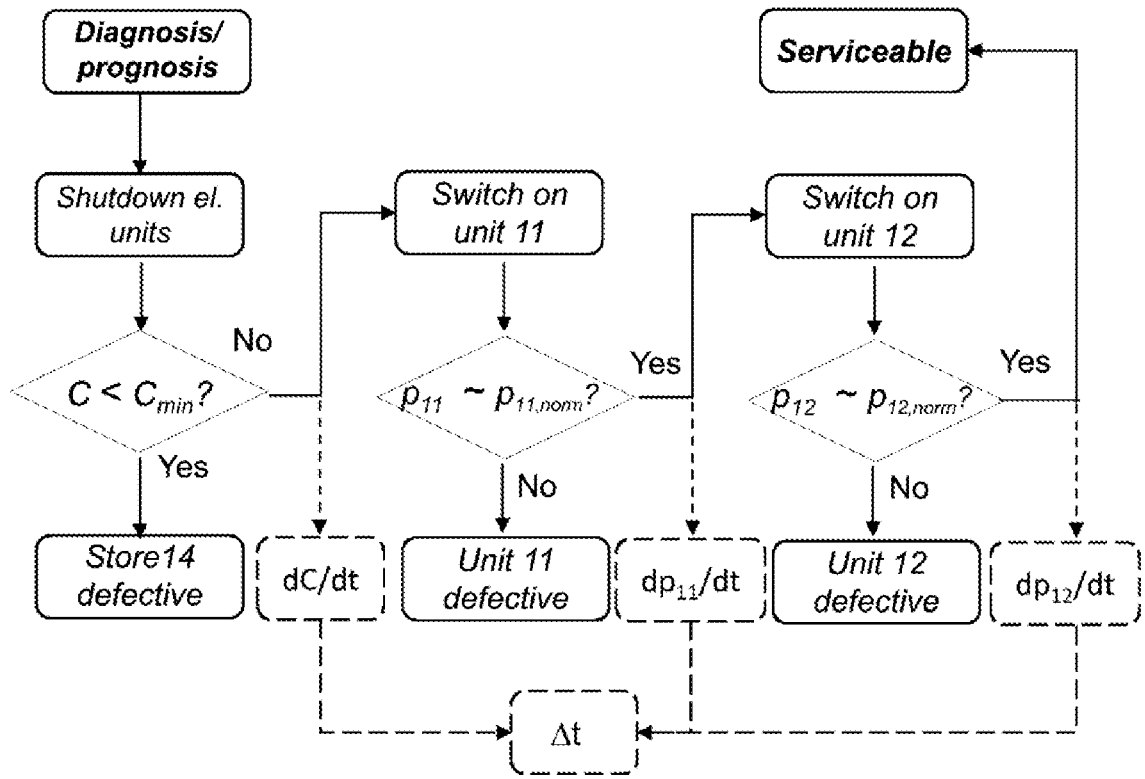
FIG. 3 shows a schematic sequence of the method according to the present disclosure.

This can be prevented with the aid of the method according to the invention that is illustrated in FIG. 3: On the one hand, it can be diagnosed whether the fill-level measuring device 1 is still serviceable. If this is the case, a remaining service time Δt until presumable unserviceability may be predicted on this basis.

To test the serviceability, the control unit 13 of the fill-level measuring device 1 first switches off all the electronic units 11, 12 fed by the buffer capacitor 14 and measures the capacitance C of the buffer capacitor 14. For determining the capacitance C in farads, the control unit 13 can, for example, record the discharge voltage ($U_1$-$U_2$) of the buffer capacitor 14 for a defined time t under a known discharge resistance R in order to determine the capacitance thus:

$$U_2 = U_1 * e^{-\frac{t}{R*C}}$$

If the buffer capacitor 14 falls below the previously defined minimum capacitance $C_{min}$, the buffer capacitor 14 and thus the fill-level measuring device 1 will have to be classified as unserviceable.

Since, depending on the design of the capacitor 14 or of the energy store, its capacitance C also depends on the ambient temperature, the minimum capacitance $C_{min}$ in the control unit 13 can be stored as a function dependent on temperature, for example in the form of a look-up table. Such a design requires that the fill-level measuring device 1 additionally comprises a temperature sensor for detecting the current temperature.

If the buffer capacitor 14 does not lie below the minimum capacitance $C_{min}$, it is eliminated as an error source. In this case, the capacitance value C obtained can be stored chronologically per measuring cycle in order to generate a change function over time dC/dt of the capacitance value C from the values stored over the measuring cycles.

At least when the buffer capacitor 14 is intact, the method according to the invention envisages measuring the power consumption $p_{11}$, $p_{12}$ at the buffer capacitor 14. For this purpose, one of the switched-off electronic units 11, 12 is switched on again in order to measure the power consumption $p_{11}$ at the buffer capacitor 14 in this state. Since only the reactivated electronic unit 11 contributes to the power consumption, the power consumption $p_{11}$ measured at the buffer capacitor 14 can be assigned to the power consumption of the reactivated signal-generating unit 11.

The power consumption $p_{11}$ can in turn be determined by measuring the voltage drop over time $U_1$-$U_2$ at the buffer capacitor 14 after the signal-generating unit 11 has been switched on, thus $$p_{11,12} = C * \frac{(U_1 - U_2)^2}{2 * t}.$$

The time there corresponds to the measuring time or the time during which the signal-generating unit 11 is switched on.

The control unit 13 can also compare the determined power consumption $p_{11}$ with a known normal consumption $p_{norm}$ of the signal-generating unit 11. If the power consumption $p_{11}$ deviates significantly from the normal consumption $p_{norm}$, the reactivated electronic unit 11 and again also the entire fill-level measuring device 1 must according to the invention be classified as unserviceable.

Analogously, the second electronic unit 12 or any further electronic unit which is fed from the buffer capacitor 14 can be used when the power consumption $p_{11}$ of the first switched-on electronic unit 11 (or all previously switched-on units) does not deviate significantly from the normal consumption $p_{norm}$:

turning the second or further electronic unit 12 on again (in this case, the first switched-on unit 11 can either remain switched on or switched off)

measurement of the power consumption $p_{12}$ at the buffer capacitor 14, and classification of the second switched-on electronic unit 12 as unserviceable if its power consumption $p_{12}$ deviates from the corresponding normal consumption $p_{norm}$.

Depending on whether and which of the components 11, 12, 14 of the fill-level measuring device 1 have been classified as unserviceable, the unserviceability can be communicated via the interface of the higher-level unit 4. It goes without saying that the method steps according to the invention, which are explained in FIGS. 1 and 2 with reference to the fill-level measuring device 1, are applicable in general to each type of field device in which the clock rate fc at which the respective process variable is measured is regulated as a function of the state of charge of the underlying energy store.

As is further evident from FIG. 3, the determined power consumption $p_{11}$, $p_{12}$ can be stored chronologically not only for the buffer capacitor 14 but also for the signal-generating unit 11 or for the evaluation unit 12 (provided the fill-level measuring device 1 is still classified as serviceable) in order to produce a change function $dp_{11,12}/dt$ of the power consumption on this basis analogously to the capacitance C.

The change functions dp/dt, dC/dt can be used, in addition to diagnosing the serviceability, to additionally make a prognosis as to when the fill-level measuring device 1 will probably no longer be serviceable. Such a prediction can be used to be able to schedule maintenance or a replacement of the fill-level measurement device 1 at an early stage on the part of the plant operator according to the principle of "predictive maintenance".

In the case of the buffer capacitor 14 an estimated remaining service time Δt up to unserviceability may be calculated by the control unit 13 calculating the corresponding remaining service time $\Delta t_1$ on the basis of the current capacitance value C and on the basis of the ascertained change function dc/dt until the minimum capacitance $C_{min}$ is expected to be reached.

Figure 4:
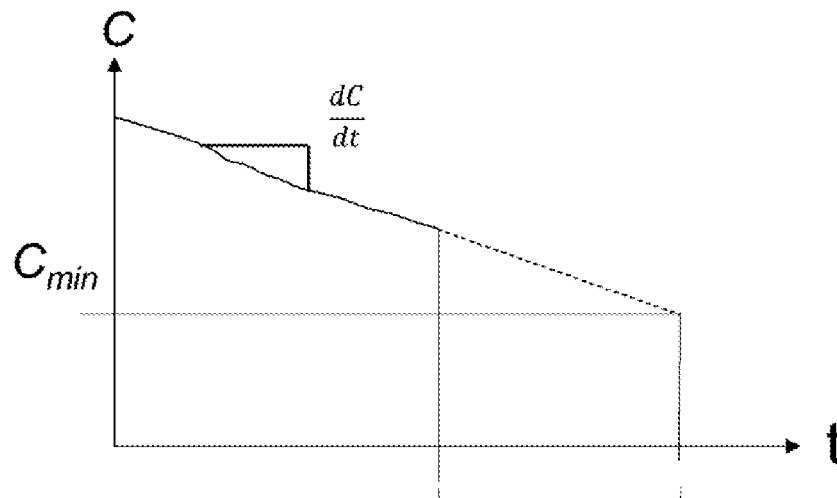
FIG. 4 shows a calculation of the remaining service time of the fill-level measurement device.

The determination of the remaining service time $C_{min}$ is shown schematically in FIG. 4 taking the example of the buffer capacitor 14. An approximately linear drop in the capacitance C of the buffer capacitor 14 as the service time of the fill-level measuring device 1 progresses is shown here for illustrative purposes. Accordingly, in the exemplary embodiment shown in FIG. 4, a linear function can be used as the function type of the change function dC/dt. In general, however, the change function dC/dt may not be optimally approximated by a linear function, so that, for example, a polynomial function would provide an improved approximation to the profile of the capacitance C over the past measuring cycles. Accordingly, the evaluation unit 13 can be programmed, for example, in such a way that it obtains a suitable function type of the corresponding change function dC/dt by means of the least squares method. In this way, the remaining service time Δt of the field device can be predicted with even greater precision.

Although in FIG. 4 the creation of the change function dC/dt is only illustrated by the example of the buffer capacitor 14, a possible change function $dp_{11,12}/dt$ of the signal-generating unit 11 or of the evaluation unit 12 can likewise be established on the basis of the methodology described in FIG. 4 in order to again derive therefrom a separate remaining service time $\Delta t_{2,3}$. The creation of a change function dU/dt on the basis of the measured voltage drops $U_1$-$U_2$ at the buffer capacitor 14 is also conceivable, provided the power consumption $p_{11}$ or the capacitance C is measured on the basis of the voltage drop over time $U_1$-$U_2$.

If a separate remaining service time Δt is calculated on the basis of the buffer capacitor 14 as well as on the basis of one of the electronic units 11, 12, the control unit 13 will be able to define, for example, the shortest of the determined remaining service times $\Delta t_{1,2,3}$ as the relevant remaining service time Δt until the the fill-level measuring device 1 is unserviceable.

The invention claimed is:

1. A method for determining a serviceability of a field device, the method comprising:
   providing the field device, including:
      an energy store;
      a signal-generating unit which is fed by the energy store and is designed to emit a radar or ultrasound signal in a direction of a filling material in a container;
      an evaluation unit which is fed by the energy store and is designed to determine a fill level on the basis of a signal reflected at a filling material surface; and
      a control unit designed to:
         switch on and off the signal-generating unit and the evaluation unit or individual function blocks thereof;
         measure a power consumption at the energy store for power consumed by the signal-generating unit and the evaluation unit, after switching on the signal-generating unit and the evaluation unit or individual function blocks thereof;
         measure a capacitance of the energy store after switching off the signal-generating unit and the evaluation unit or individual function blocks thereof;
         classify the field device as unserviceable when the capacitance of the energy store falls below a minimum capacitance indicating a defect of the energy store; and
         classify the field device as unserviceable when the power consumption deviates from a defined normal consumption indicating a defect of at least one of the signal-generating unit or the evaluation unit.

2. The method according to claim 1, wherein the capacitance is measured by measuring a voltage drop over time at the energy store during a defined discharge of the energy store.

3. The method according to claim 2, wherein the field device is classified as unserviceable if the measured voltage drop exceeds a predefined maximum voltage drop.

4. The method according to claim 2, further comprising:
   when the capacitance of the energy store does not fall below the defined minimum capacitance, determining a first change function of the capacitance via progressive measurement cycles; and
   calculating, based on the current capacitance and the change function, a first remaining service time until the minimum capacitance is undershot.

5. The method according to claim 4, further comprising:
   when the power consumption on the energy store does not deviate from the defined normal consumption, determining a second change function of the power consumption via progressive measurement cycles; and
   calculating, based on the current power consumption and the second change function, a second remaining service time until a minimum deviation from the normal consumption is exceeded.

6. The method according to claim 5, further comprising:
   when the measured voltage drop does not exceed a predefined maximum voltage drop, determining a third change function of the voltage drop via progressive measurement cycles; and calculating, using the measured voltage drop and using the third change function, a third remaining service time until the predefined maximum voltage drop is exceeded.

7. The method according to claim 6, wherein a suitable function type of the first change function, the second change function, and/or the third change function is ascertained by means of a least squares method.

8. The method according to claim 1, further comprising:
measuring a temperature at the field device; and
defining the minimum capacitance as a temperature-dependent function.

9. A fill-level measuring device, comprising:
an energy store;
a signal-generating unit which is fed by the energy store and is designed to emit a radar or ultrasound signal in a direction of a filling material in a container;
an evaluation unit which is fed by the energy store and is designed to determine a fill level on the basis of a signal reflected at a filling material surface; and
a control unit designed to:
switch on and off the signal-generating unit and the evaluation unit or individual function blocks thereof;
measure a power consumption at the energy store for power consumed by the signal-generating unit and the evaluation unit, after switching on the signal-generating unit and the evaluation unit or individual function blocks thereof;
measure a capacitance of the energy store after switching off the signal-generating unit and the evaluation unit or individual function blocks thereof; and
classify the fill-level measuring device as unserviceable when the capacitance of the energy store falls below a minimum capacitance indicating a defect of the energy store; and
classify the fill-level measuring device as unserviceable when the power consumption deviates from a defined normal consumption indicating a defect of at least one of the signal-generating unit or the evaluation unit.

10. The fill-level measuring device according to claim 9, wherein the control unit is further designed, on the basis of the measured capacitance and/or on the basis of the measured power consumption, to calculate a remaining service time up to the unserviceability of the fill-level measuring device provided the control unit currently classifies the fill-level measuring device as serviceable.

11. The fill-level measuring device according to claim 9, wherein the control unit is further designed to transmit a possible unserviceability or a remaining service time to a higher-level unit.

12. The fill-level measuring device according to claim 9, wherein the energy store is designed as a buffer capacitor that can be connected to a higher-level unit for re-charging.

* * * * *